(12) United States Patent
Filoramo et al.

(10) Patent No.: US 10,797,704 B2
(45) Date of Patent: Oct. 6, 2020

(54) DIFFERENTIAL SIGNAL TRANSFER SYSTEMS AND ASSOCIATED METHODS

(71) Applicant: Maxim Integrated Products, Inc., San Jose, CA (US)

(72) Inventors: Pietro Filoramo, Syracuse (IT); Angelo Genova, Catania (IT)

(73) Assignee: Maxim Integrated Products, Inc., San Jose, CA (US)

( * ) Notice: Subject to any disclaimer, the term of this patent is extended or adjusted under 35 U.S.C. 154(b) by 0 days.

(21) Appl. No.: 16/559,882

(22) Filed: Sep. 4, 2019

(65) Prior Publication Data

US 2020/0076434 A1 Mar. 5, 2020

Related U.S. Application Data

(60) Provisional application No. 62/726,507, filed on Sep. 4, 2018.

(51) Int. Cl.
*H03K 19/0185* (2006.01)
*H02M 3/07* (2006.01)

(52) U.S. Cl.
CPC ...... *H03K 19/018528* (2013.01); *H02M 3/07* (2013.01)

(58) Field of Classification Search
None
See application file for complete search history.

(56) References Cited

U.S. PATENT DOCUMENTS

| 3,761,831 | A | * | 9/1973 | Foerster | H03F 3/45 330/69 |
|---|---|---|---|---|---|
| 6,819,170 | B1 | | 11/2004 | Kindt | |
| 7,170,437 | B2 | | 1/2007 | Makarem et al. | |
| 7,193,464 | B2 | | 3/2007 | Wang et al. | |
| 8,854,125 | B2 | * | 10/2014 | Ikeda | H03F 1/34 330/144 |
| 9,246,477 | B2 | * | 1/2016 | Li | H03F 3/45475 |
| 9,264,002 | B2 | * | 2/2016 | Ni | H03F 3/2173 |

\* cited by examiner

*Primary Examiner* — Jeffery S Zweizig
(74) *Attorney, Agent, or Firm* — Lathrop GPM LLP

(57) ABSTRACT

A differential signal transfer system includes a dynamic level-shifter and a common-mode rejection device. The dynamic level-shifter is configured to (a) receive an input signal including a differential-mode component and a first common-mode component and (b) generate a level-shifted signal from the input signal, the level-shifted signal including the differential-mode component and a second common-mode component that is different from the first common-mode component. The common-mode rejection device is configured to receive the level-shifted signal and generate an output signal therefrom, where the output signal includes the differential-mode component.

19 Claims, 13 Drawing Sheets

DIFFERENTIAL SIGNAL TRANSFER SYSTEMS AND ASSOCIATED METHODS

RELATED APPLICATIONS

This application claims benefit of priority to U.S. Provisional Patent Application Ser. No. 62/726,507, filed on Sep. 4, 2018, which is incorporated herein by reference.

BACKGROUND

Information is commonly transferred in electrical systems using differential signals. Differential signals are generally less susceptible to noise-induced corruption than single-ended signals, and differential signals are therefore frequently used to transfer information in noisy environments, such as in automotive environments and in industrial environments, to help achieve reliable information transfer. It is sometimes necessary to transfer a differential signal from one voltage domain to another voltage domain, such as in applications where the differential signal is transferred between two systems operating at different common-mode voltages or in presence of high common-mode dynamic disturbs. Accordingly, differential signal transfer systems have been developed to transfer differential signals between two systems operating at different common-mode voltages also in presence of time variant common-mode with high dynamic range.

DETAILED DESCRIPTION OF THE EMBODIMENTS

Figure 1:
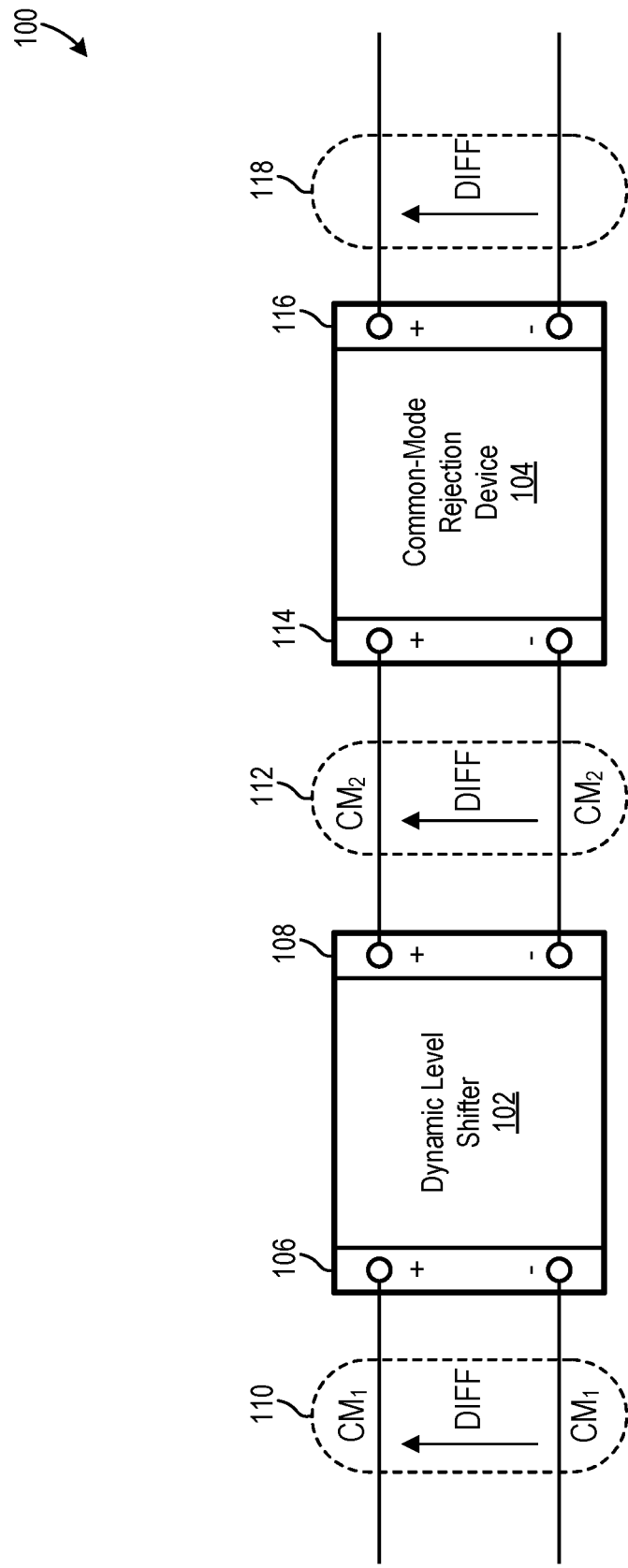
FIG. 1 is a schematic diagram illustrating a differential signal transfer system, according to an embodiment.

Differential signal transfer systems may be exposed to high-voltages in certain applications, such as in applications with significant common-mode noise. For example, a differential signal transfer system in an automobile may dynamically experience input common-mode voltage signals of about 10.5 volts or greater due to noise generated by the automobile. Consequently, a differential signal transfer system may need to limit input signal voltage magnitude, such as by use of voltage clamping devices, to prevent damage to the differential signal transfer system. Such limiting of input signal voltage magnitude may cause loss of information transferred by the input signal.

Alternately, a differential signal transfer system may be configured to withstand high input common-mode voltage. Conventional differential signal transfer systems typically achieve a high-voltage rating by use of high-voltage rated capacitors, active level shifters with high-voltage rated solid-state devices, and/or voltage dividers to divide-down voltage magnitude. Applicant has found, however, that such conventional techniques of achieving a high-voltage rating may have significant drawbacks. For example, high-voltage rated integrated components, such as capacitors and transistors, are typically more expensive that their low-voltage rated counterparts, and high-voltage components generally have inferior reliability and longevity compared to otherwise similar low-voltage components. Additionally, voltage dividers divide-down magnitude of differential signals as well as common-mode signals, and a voltage divider may therefore undesirably attenuate differential signals.

Applicant has developed differential signal transfer systems which may at least partially overcome one or more of the above-discussed drawbacks associated with conventional differential signal transfer systems. Certain embodiments of the new differential signal transfer systems have a high-voltage rating and therefore may operate without clamping voltage of an input signal, which helps prevent loss of information represented by the input signal. Additionally, some embodiments achieve a high-voltage rating without requiring high-voltage capacitors or high-voltage solid-state devices, thereby promoting low-cost, high-reliability, and longevity. Furthermore, particular embodiments achieve a high-voltage rating without dividing-down the differential-mode component of the signal being transferred, thereby promoting signal integrity. Moreover, certain embodiments substantially reject the common-mode component of the signal being transferred, thereby promoting immunity to common-mode noise.

Particular embodiments of the new differential signal transfer systems include a dynamic level-shifter and a low voltage common-mode rejection device. In certain embodiments, the dynamic level-shifter changes a magnitude of a common-mode component of a signal being transferred, but the dynamic level-shifter does not significantly change a differential-mode component of the signal being transferred. For example, in some embodiments, the dynamic level-shifter reduces the magnitude of the common-mode component of the signal being transferred without significantly changing magnitude of the differential-mode component of the signal being transferred. The common-mode rejection device substantially rejects the common-mode component of the signal being transferred while transferring the differential-mode component of the signal being transferred. In certain embodiments where the dynamic level-shifter reduces the magnitude of the common-mode component of the signal being transferred, the common-mode rejection device does not include integrated high-voltage rated capacitors or high-voltage rated transistors.

FIG. 1 is a schematic diagram illustrating a differential signal transfer system 100, which is one embodiment of the new differential signal transfer systems developed by Applicant. Differential signal transfer system 100 includes a dynamic level-shifter 102 and a low voltage common-mode rejection device 104. Dynamic level-shifter 102 includes an input port 106 and an output port 108. Input port 106 is configured to receive an input signal 110, where input signal 110 includes a differential-mode component DIFF and a first common-mode component $CM_1$. Dynamic level-shifter 102 is configured to generate a level-shifted signal 112 from input signal 110, where level-shifted signal 112 includes differential-mode component DIFF and a second common-mode component $CM_2$. Second common-mode component $CM_2$ is different from first common-mode component $CM_1$, i.e., magnitude of second common-mode component $CM_2$ is different from magnitude of first common-mode component $CM_1$. While not required, it is anticipated that magnitude of second common-mode component $CM_2$ will be smaller than magnitude of first common-mode component $CM_1$ so that dynamic level-shifter 102 reduces common-mode component magnitude, to prevent common-mode rejection device 104 from being exposed to a high-voltage common-mode component, while enabling input signal 110 to contain a high-voltage common-mode component. Output port 108 is configured to output level-shifted signal 112 to common-mode rejection device 104.

Common-mode rejection device 104 includes an input port 114 and an output port 116. Input port 114 is configured to receive level-shifted signal 112 from dynamic level-shifter 102, and output port 116 is configured to output the output signal 118. Common-mode rejection device 104 is configured to generate output signal 118 from level-shifted signal 112, where output signal 118 includes differential component DIFF. In certain embodiments, output signal 118 is substantially free of second common-mode component $CM_2$, i.e., magnitude of any second common-mode component $CM_2$ present in output signal 118 is no more than one percent of magnitude of second common-mode component $CM_2$ present in level-shifted signal 112.

In some embodiments, common-mode rejection device 104 includes digital circuitry, e.g., a digital transceiver configured to transmit differential-mode component DIFF and reject second common-mode component $CM_2$. In some other embodiments, common-mode rejection device 104 includes a charge pump, e.g., one of the charge pumps discussed below with respect to FIGS. 8 and 9.

Figure 2:
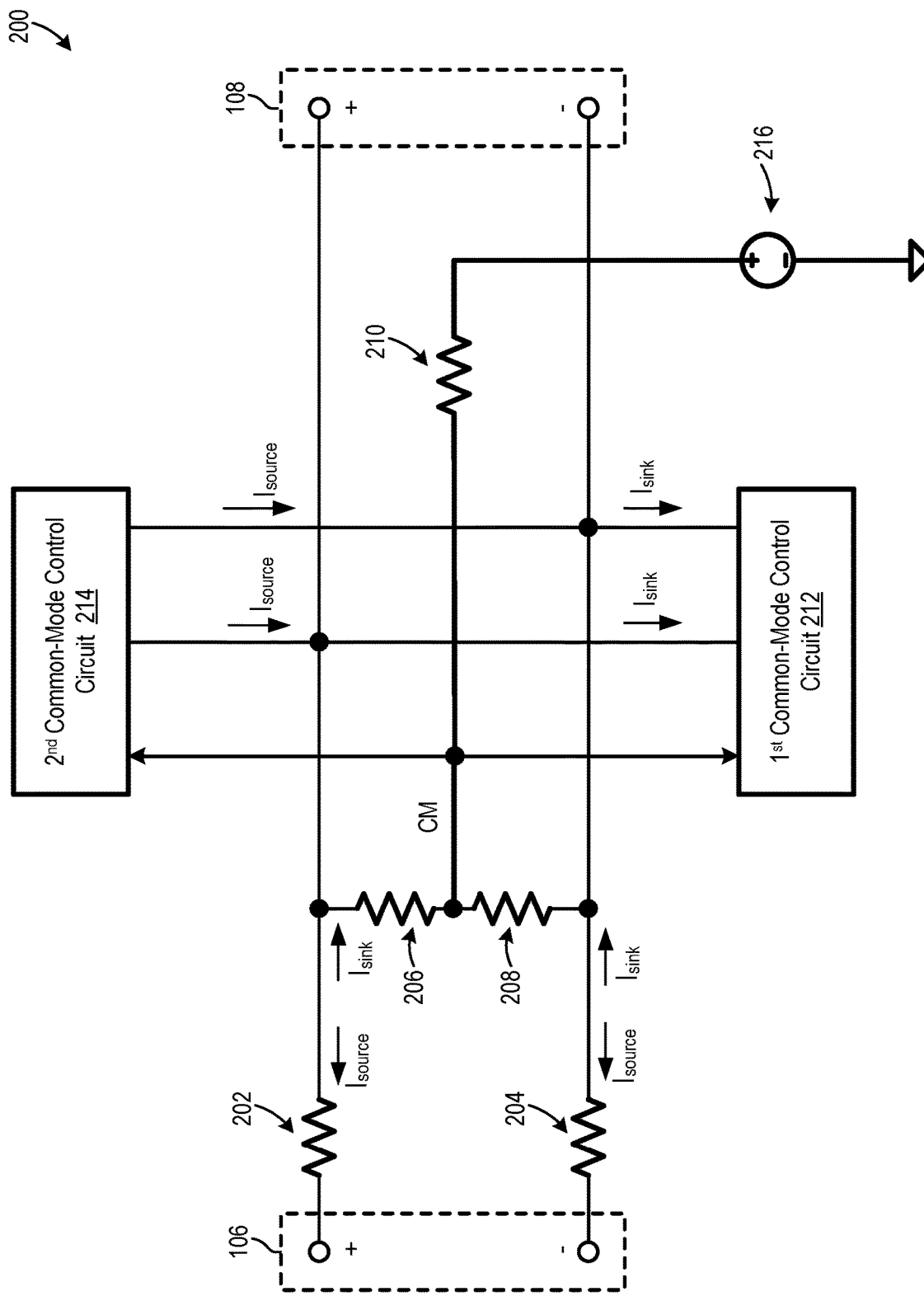
FIG. 2 is a schematic diagram illustrating a dynamic level-shifter, according to an embodiment.

FIG. 2 is a schematic diagram illustrating a dynamic level-shifter 200, where dynamic level-shifter 200 is one possible embodiment of dynamic level-shifter 102 of FIG. 1. Dynamic level-shifter 200 includes input port 106, output port 108, a first resistive device 202, a second resistive device 204, a third resistive device 206, a fourth resistive device 208, an optional fifth resistive device 210, a first common-mode control circuit 212, a second common-mode control circuit 214, and an optional voltage source 216. Although each of first resistive device 202, second resistive device 204, third resistive device 206, fourth resistive device 208, and fifth resistive device 210 is depicted as a single resistor, one or more of these resistive devices could include a plurality of resistors, or one or more devices emulating resistors, without departing from the scope hereof.

Each of first resistive device 202 and second resistive device 204 is electrically coupled between input port 106 and output port 108. Specifically, first resistive device 202 is electrically coupled between a positive node (+) of input port 106 and a positive node (+) of output port 108, and second resistive device 204 is electrically coupled between a negative node (−) of input port 106 and a negative node (−) of output port 108. Third resistive device 206 and fourth resistive device 208 are electrically coupled in series across output port 108, i.e., between positive node (+) of output port 108 and negative node (−) of output port 108, and third and fourth resistive devices 206 and 208 are electrically coupled together at a common-mode node CM. In certain embodiments, each of first resistive device 202 and second resistive device 204 have a common resistance value, and each of third resistive device 206 and fourth resistive device 208 have a common resistance value. While not required, it is anticipated that first and second resistive devices 202 and 204 will have smaller resistance values than third and fourth resistive devices 206 and 208, to help minimize attenuation of differential-mode component DIFF. Each of first common-mode control circuit 212 and second common-mode control circuit 214 is electrically coupled to each of common-mode node CM, positive node (+) of output port 108, and negative node (−) of output port 108.

First common-mode control circuit 212 and second common-mode control circuit 214 collectively control magnitude of common mode voltage at output port 108, i.e., magnitude of second common-mode component $CM_2$, under dynamic conditions by causing current to flow through first resistive device 202 and second resistive device 204. In particular, first common-mode control circuit 212 is configured to monitor voltage at common-mode node CM and sink current $I_{sink}$ through each of first and second resistive devices 202 and 204 to prevent magnitude of second common-mode component $CM_2$ from exceeding a maximum value $VRAIL_{UP}$. Similarly, second common-mode control circuit 214 is configured to monitor voltage at common-mode node CM and source current $I_{source}$ through each of first and second resistive devices 202 and 204 to prevent magnitude of second common-mode component $CM_2$ from falling below a minimum value $VRAIL_{DW}$. Consequently, in these embodiments, magnitude of second common-mode component $CM_2$ at most substantially ranges from minimum value $VRAIL_{DW}$ to maximum value $VRAIL_{UP}$.

Optional fifth resistive device 210 and voltage source 216 collectively fix magnitude of second common-mode component $CM_2$ at a predetermined value when magnitude of first common-mode component $CM_1$ is static. The predetermined value is a function of the magnitude of voltage source 216 and the resistance values of third resistive device 206, fourth resistive device 208, and fifth resistive device 210.

Figure 3:
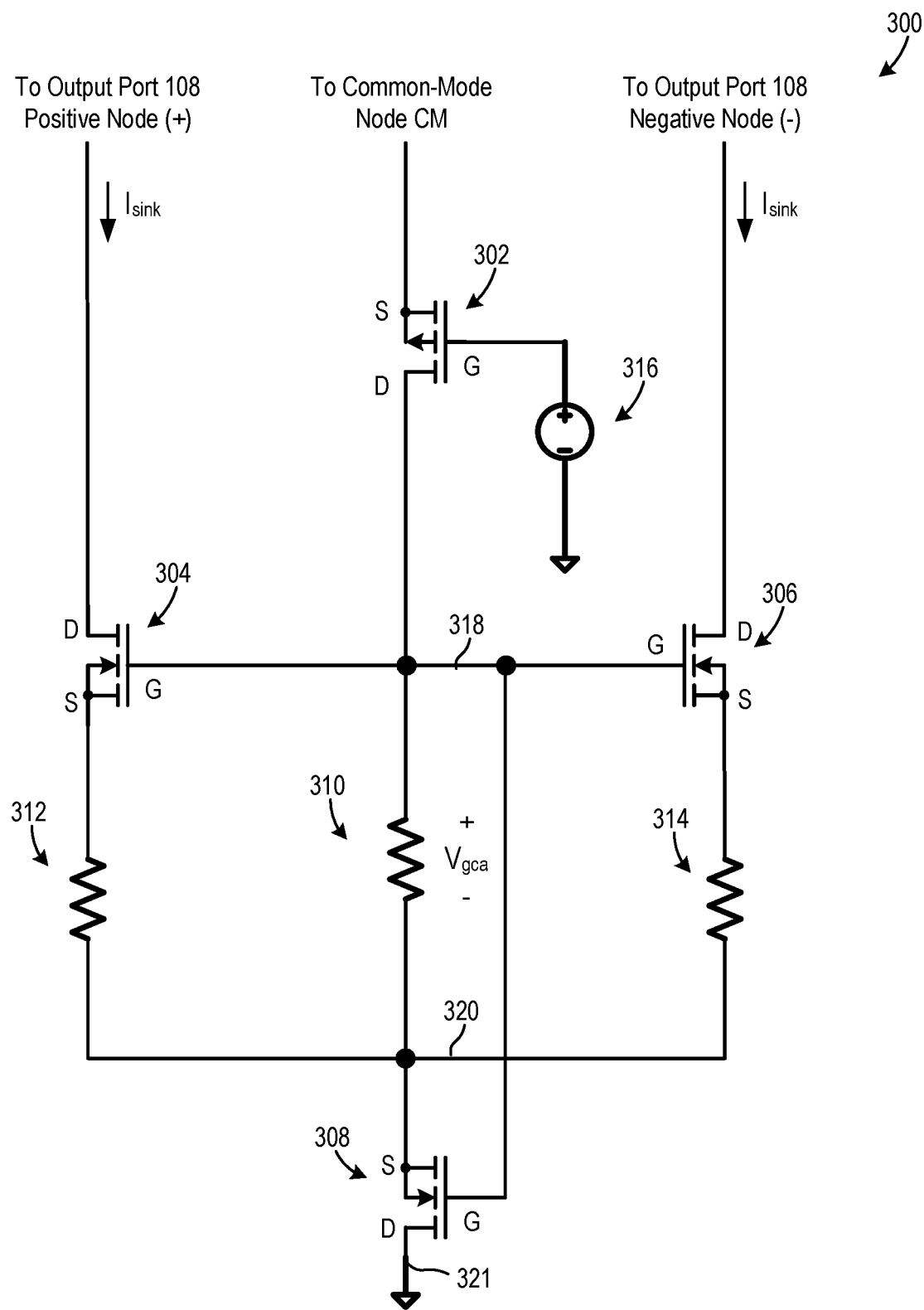
FIG. 3 is a schematic diagram illustrating one possible embodiment of a first common-mode control circuit of the FIG. 2 dynamic level-shifter.

FIG. 3 is a schematic diagram illustrating a first common-mode control circuit 300, which is one possible embodiment of first common-mode control circuit 212 of dynamic level-shifter 200. First common-mode control circuit 300 includes a first transistor 302, a second transistor 304, a third transistor 306, an optional fourth transistor 308, a first resistive device 310, a second resistive device 312, a third resistive device 314, and a voltage source 316. A source S of first transistor 302 is electrically coupled to common-mode node CM, and a drain D of first transistor 302 is electrically coupled to a gate control node 318. A gate G of first transistor 302 is electrically coupled to voltage source 316, and in some embodiments, voltage source 316 is the same as voltage source 216 of FIG. 2. Respective gates G of each of second transistor 304, third transistor 306, and fourth transistor 308 are electrically coupled to gate control node 318, and respective drains D of second transistor 304 and third transistor 306 are electrically coupled to positive (+) and negative (−) nodes of output port 108, respectively. First resistive device 310 is electrically coupled between gate control node 318 and a bias node 320, and a source S of fourth transistor 308 is electrically coupled to bias node 320. A drain D of fourth transistor 308 is electrically coupled to a reference node 321. Second resistive device 312 is electrically coupled between a source S of second transistor 304 and bias node 320, and third resistive device 314 is electrically coupled between a source S of third transistor 306 and bias node 320.

Maximum value $VRAIL_{UP}$ is equal to voltage of voltage source 316 plus source-to-gate voltage of first transistor 302. Current through first transistor 302 generates a voltage $V_{gca}$ across first resistive device 310 to drive gates of second transistor 304 and third transistor 306, thereby controlling magnitude of sink current $I_{sink}$. Accordingly, first common-mode control circuit 300 cooperates with first through fourth resistive devices 202-208 of FIG. 2 to form a control loop which at least substantially prevents magnitude of voltage at common-mode node CM from exceeding maximum value $VRAIL_{UP}$. It can be determined that the higher the gain of the control loop, the closer maximum voltage at common-mode node CM is to maximum value $VRAIL_{UP}$. Fourth transistor 308, second resistive device 312, and third resistive device 314 collectively act as degeneration resistors of second transistor 304 and third transistor 306. Optional fourth transistor 308 allows a dynamic extension below ground when second common-mode control circuit 214 is working and first common-mode control circuit 212 is OFF.

Although FIG. 3 illustrates the transistors of first common-mode control circuit 300 being n-channel and p-channel metal oxide semiconductor field effect transistors (MOSFETs), first common-mode control circuit 300 could be modified to include a different type of transistors, e.g., bipolar junction transistors (BJTs), without departing from the scope hereof. Additionally, first common-mode control circuit 300 could be modified to replace the n-channel MOSFETs with p-channel MOSFETs, and vice versa, without departing from the scope hereof Although each of first resistive device 310, second resistive device 312, and third resistive device 314 is depicted as a single resistor, one or more of these resistive devices could include a plurality of resistors, or one or more devices emulating resistors, without departing from the scope hereof.

Figure 4:
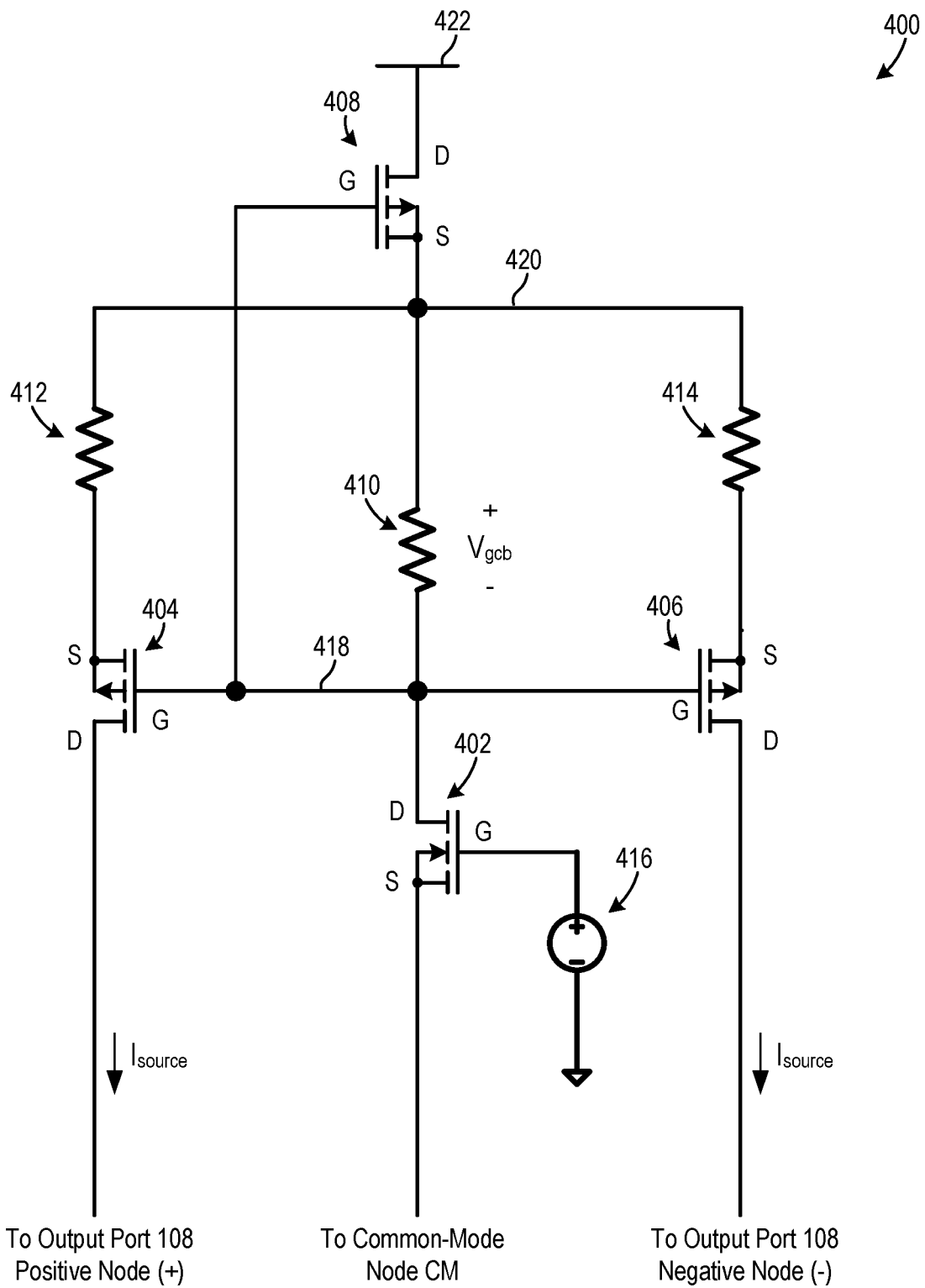
FIG. 4 is a schematic diagram illustrating one possible embodiment of a second common-mode control circuit of the FIG. 2 dynamic level-shifter.

FIG. 4 is a schematic diagram illustrating a second common-mode control circuit 400, which is one possible embodiment of second common-mode control circuit 214 of dynamic level-shifter 200. Second common-mode control circuit 400 includes a first transistor 402, a second transistor 404, a third transistor 406, an optional fourth transistor 408, a first resistive device 410, a second resistive device 412, a third resistive device 414, and a voltage source 416. A source S of first transistor 402 is electrically coupled to common-mode node CM, and a drain D of first transistor 402 is electrically coupled to a gate control node 418. A gate G of first transistor 402 is electrically coupled to voltage source 416, and in some embodiments, voltage source 416 is the same as voltage source 216 of FIG. 2. Respective gates G of each of second transistor 404, third transistor 406, and fourth transistor 408 are electrically coupled to gate control node 418, and respective sources S of second transistor 404 and third transistor 406 are electrically coupled to positive (+) and negative (−) nodes of output port 108, respectively. First resistive device 410 is electrically coupled between gate control node 418 and a bias node 420, and a source S of fourth transistor 408 is electrically coupled to bias node 420. A drain D of fourth transistor 408 is electrically coupled to a rail node 422. Second resistive device 412 is electrically coupled between a source S of second transistor 404 and bias node 420, and third resistive device 414 is electrically coupled between a source S of third transistor 406 and bias node 420.

Minimum value $VRAIL_{DW}$ is equal to voltage of voltage source 416 plus gate-to-source voltage of first transistor 402. Current through first transistor 402 generates a voltage $V_{gcb}$ across first resistive device 410 to drive gates of second transistor 404 and third transistor 406, thereby controlling magnitude of source current $I_{source}$. Accordingly, second common-mode control circuit 400 cooperates with first through fourth resistive devices 202-208 of FIG. 2 to form a control loop which at least substantially prevents magnitude of voltage at common-mode node CM from falling below minimum value $VRAIL_{DW}$. It can be determined that the higher the gain of the control loop, the closer minimum voltage at common-mode node CM is to minimum value $VRAIL_{DW}$. Fourth transistor 408, second resistive device 412, and third resistive device 414 collectively act as degeneration resistors of second transistor 404 and third transistor 406. Optional fourth transistor 408 allows a dynamic extension over the supply voltage 422 when first common-mode control circuit 212 is working and second common-mode control circuit 214 OFF. Although FIG. 4 illustrates the transistors of second common-mode control circuit 400 being n-channel and p-channel MOSFETs, second common-mode control circuit 400 could be modified to include a different type of transistors, e.g., BJTs, without departing from the scope hereof. Additionally, second common-mode control circuit 400 could be modified to replace the p-channel MOSFETs with n-channel MOSFETs, and vice versa, without departing from the scope hereof. Although each of first resistive device 410, second resistive device 412, and third resistive device 414 is depicted as a single resistor, one or more of these resistive devices could include a plurality of resistors, or one or more devices emulating resistors, without departing from the scope hereof.

It should be noted that dynamic level-shifter 200 does not require high-voltage rated capacitors or transistors when first and second common control circuits 212 and 214 are implemented according to FIGS. 3 and 4, respectively. As a result, the configuration of dynamic level-shifter 200 promotes low cost, high reliability, and longevity.

Figure 5:
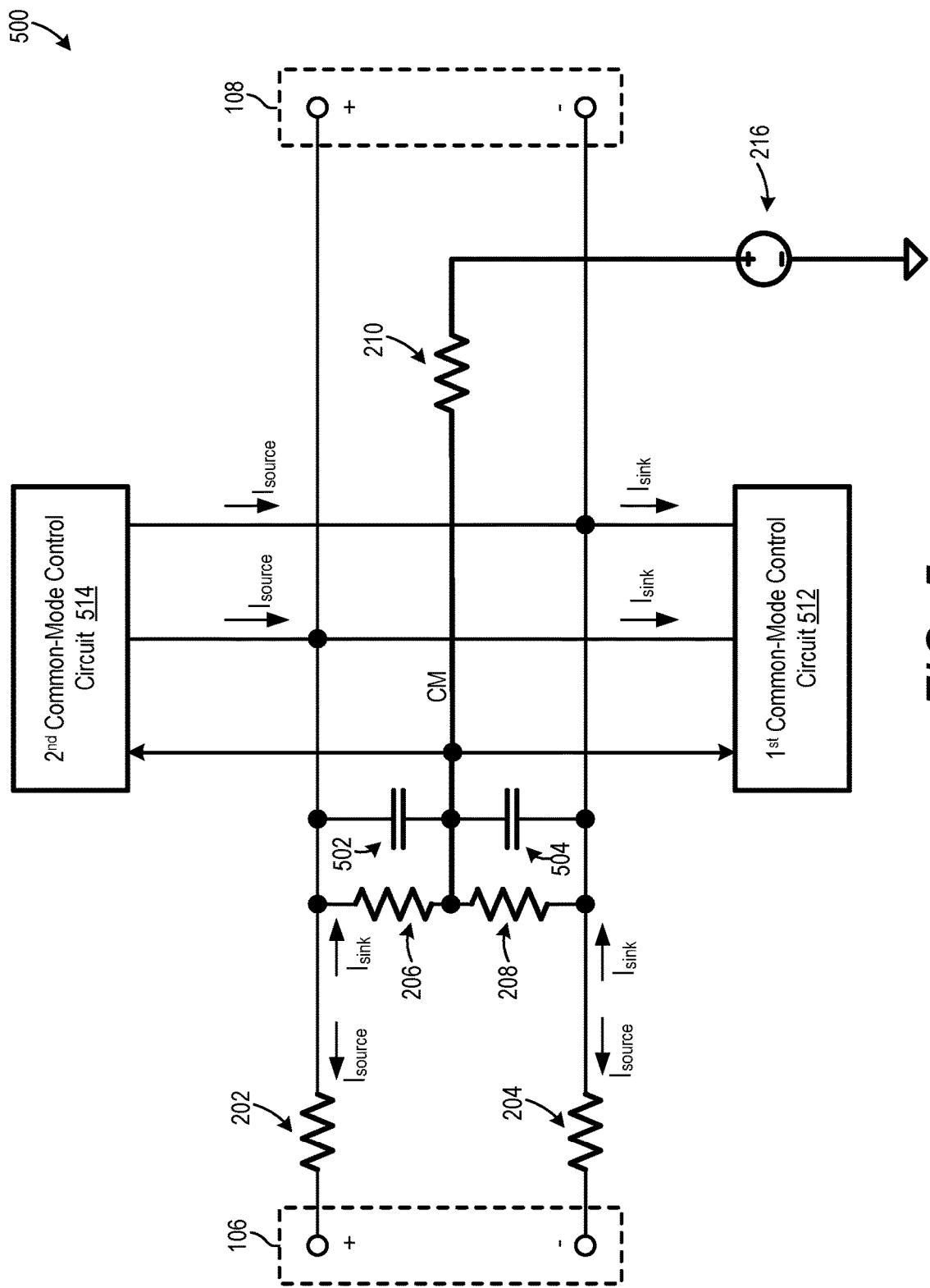
FIG. 5 is a schematic diagram illustrating another dynamic level-shifter, according to an embodiment.
Figure 6:
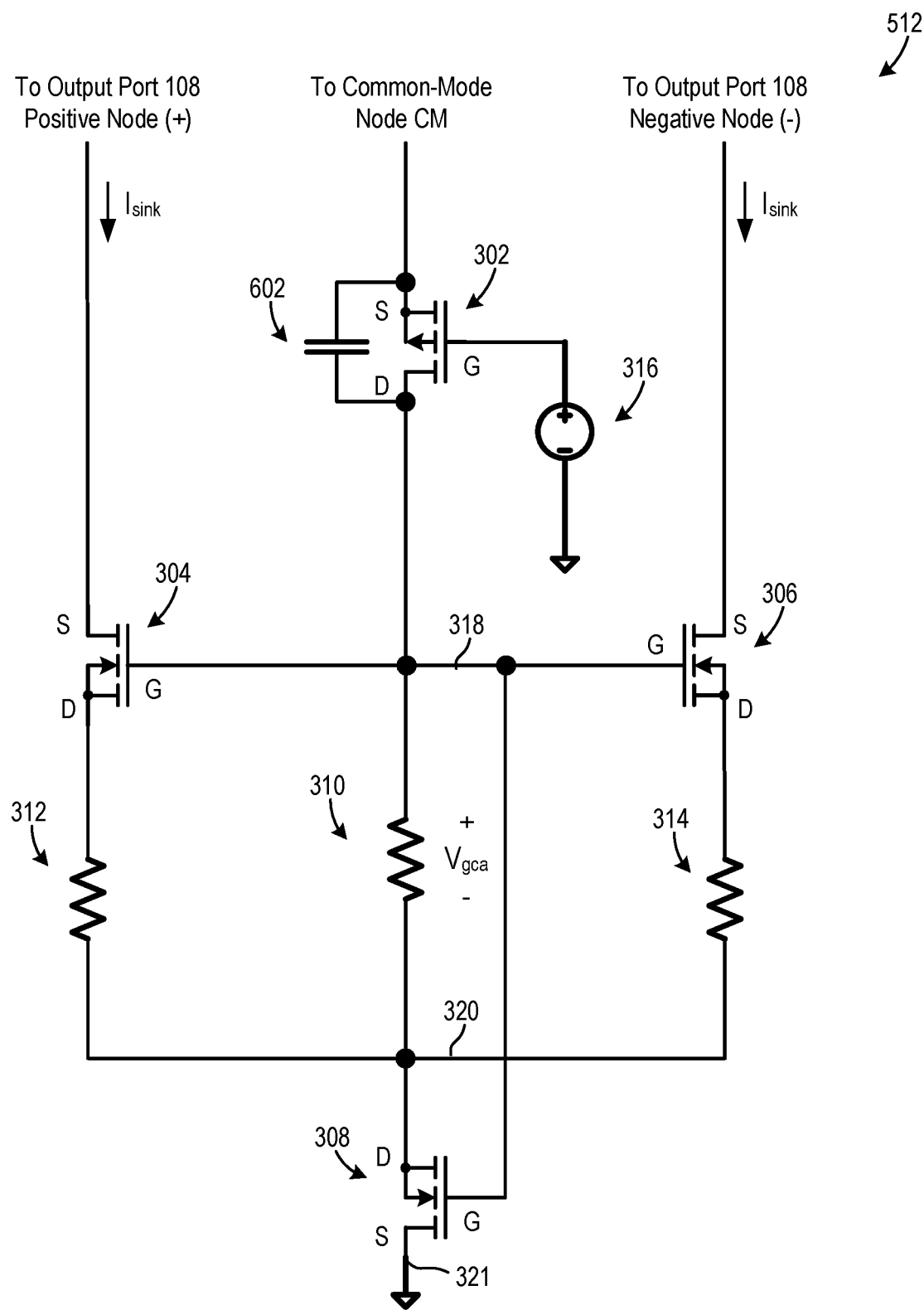
FIG. 6 is a schematic diagram illustrating one possible embodiment of a first common-mode control circuit of the FIG. 5 dynamic level-shifter.
Figure 7:
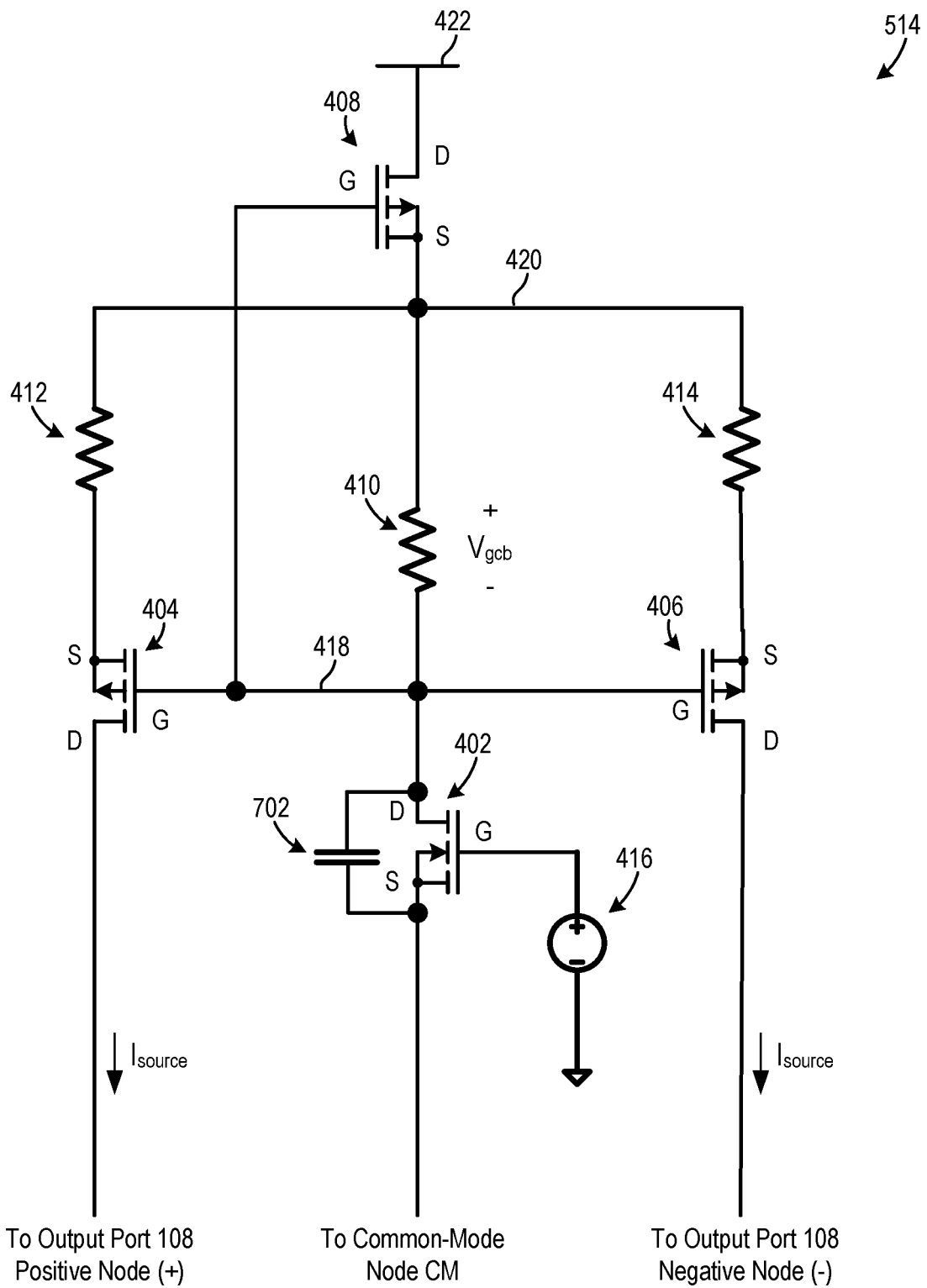
FIG. 7 is a schematic diagram illustrating one possible embodiment of a second common-mode control circuit of the FIG. 5 dynamic level shifter.

FIG. 5 is a schematic diagram illustrating a dynamic level-shifter 500, which is similar to dynamic level-shifter 200 of FIG. 2 but including (a) a first capacitor 502, (b) a second capacitor 504, (c) a first common-mode control circuit 512 in place of first common-mode control circuit 212, and (d) a second common-mode control circuit 514 in place of second common-mode control circuit 214. FIGS. 6 and 7 are schematic diagrams illustrating first common-mode control circuit 512 and second common-mode control circuit 514, respectively. First common-mode control circuit 512 is similar to first common-mode control circuit 300 of FIG. 3 but further includes a capacitor 602 electrically coupled between source S and drain D of first transistor 302. Second common-mode control circuit 514 is similar to second common-mode control circuit 400 of FIG. 4 but further includes a capacitor 702 electrically coupled between drain D and source S of first transistor 402.

First capacitor 502 and second capacitor 504 provide compensation for the control loops associated with first common-mode control circuit 512 and second common-mode control circuit 514. Additionally, first capacitor 504 and second capacitor 504 extend the bandwidth of both control loops. Capacitors 602 and 702 of FIGS. 6 and 7, respectively, provide feedforward compensation of the control loops, thereby extending working frequency range of dynamic level-shifter 500.

Figure 8:
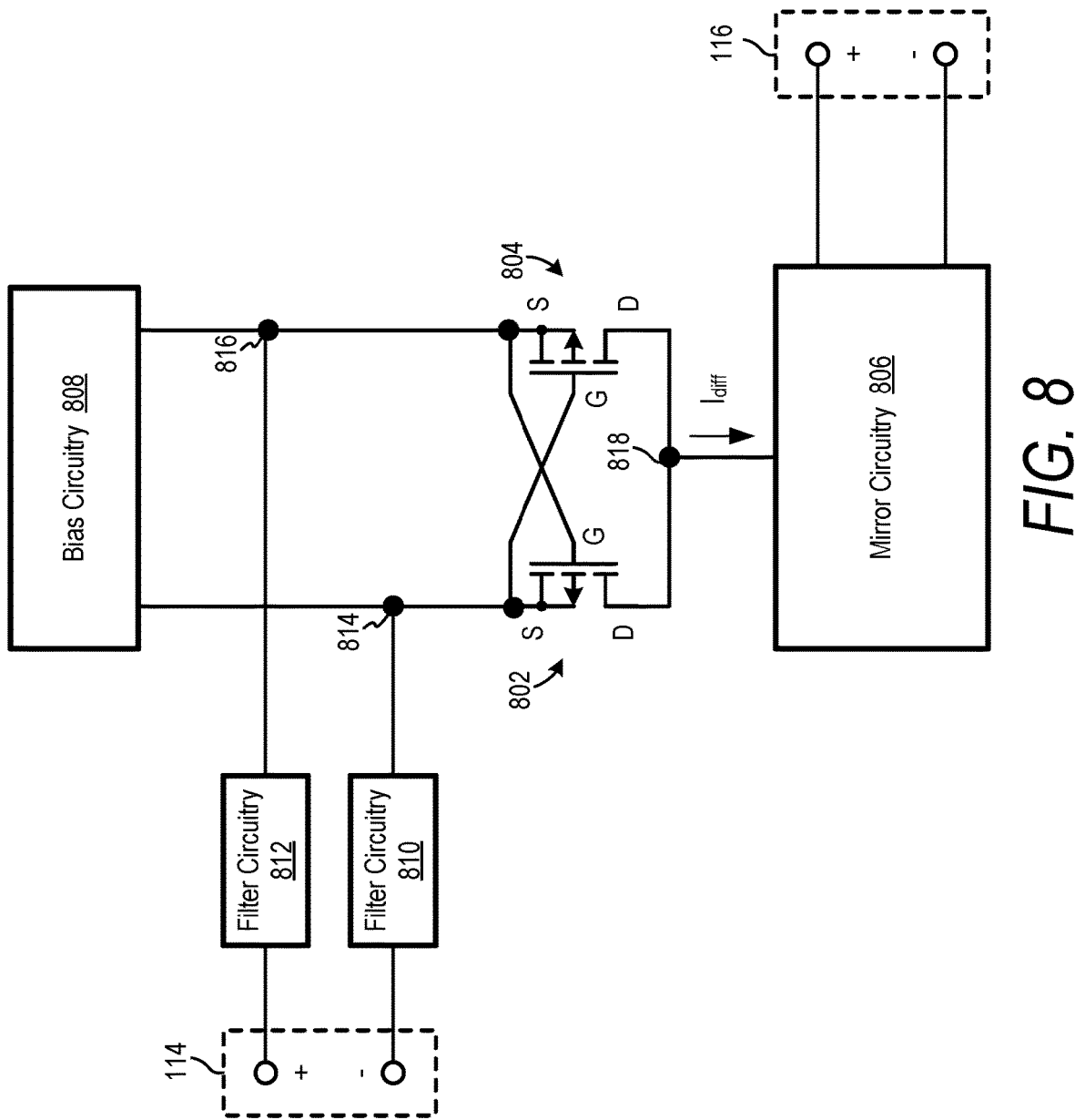
FIG. 8 is a schematic diagram illustrating a charge pump, according to an embodiment.

FIG. 8 is a schematic diagram illustrating a charge pump 800, which is one possible embodiment of common-mode rejection device 104 which is implemented as a charge pump. Charge pump 800 includes input port 114, output port 116, a first transistor 802, a second transistor 804, mirror circuitry 806, and bias circuitry 808. First filter circuitry 810 and second filter circuitry 812 are optional and help reduce sensitivity of charge pump 800 to common-mode noise. In certain embodiments, each of first filter circuitry 810 and second filter circuitry 812 includes a respective capacitor and resistor electrically coupled in series. First filter circuitry 810 is electrically coupled between a negative node (−) of input port 114 and a first control node 814, and second filter circuitry 812 is electrically coupled between a positive node (+) of input port 114 and a second control node 816.

Bias circuitry 808 is electrically coupled to each of first control node 814 and second control node 816, and bias circuitry 808 is configured to electrically bias each of first transistor 802 and second transistor 804. A source (S) of first transistor 802 is electrically coupled to first control node 814, and a drain (D) of first transistor 802 is electrically coupled to a summing node 818. A source (S) of second transistor 804 is electrically coupled to second control node 816, and a drain (D) of second transistor 804 is electrically coupled to summing node 818. A gate (G) of first transistor 802 is electrically coupled to source (S) of second transistor 804, and a gate (G) of second transistor 804 is electrically coupled to source (S) of first transistor 802. This configuration of first transistor 802 and second transistor 804 results in the two transistors being collectively configured to generate a differential current signal $I_{diff}$ in response to differential-mode component DIFF of level-shifted signal 112, while rejecting second common-mode component $CM_2$ of level-shifted signal 112. In particular, a common-mode signal on input port 114 causes first transistor 802 and second transistor 804 to operate in a balanced state, such that each transistor transmits current of minimal magnitude (ideally zero magnitude) into summing node 818. On the other hand, a differential-mode signal on input port 114 causes first transistor 802 and second transistor 804 to operate in an unbalanced state, such that one of the transistors, depending on the polarity of the differential mode signal, injects current into summing node 818. Mirror circuitry 806 mirrors differential signal $I_{diff}$ to generate output signal 118 at output port 116. Although FIG. 8 illustrates first transistor 802 and second transistor 804 as each being a p-channel MOSFETs, charge pump 800 could be modified to include a different type of transistors, e.g., n-channel MOSFETs or BJTs, without departing from the scope hereof.

Figure 9:
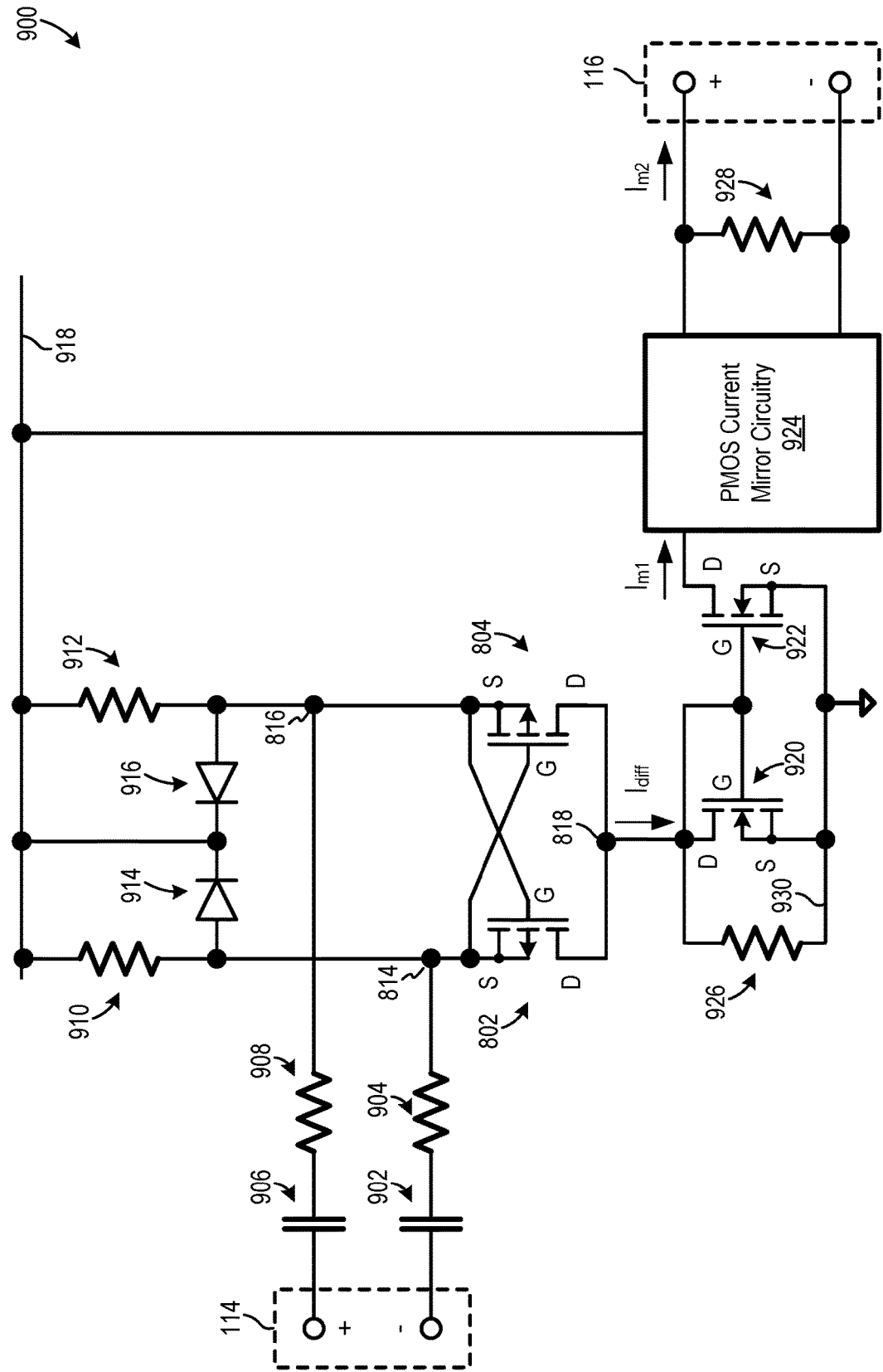
FIG. 9 is a schematic diagram illustrating another charge pump, according to an embodiment.

FIG. 9 is a schematic diagram illustrating a charge pump 900, which is an embodiment of charge pump 800 of FIG. 8. In particular, first filter circuitry 810 is implemented by a capacitor 902 and a resistor 904, and second filter circuitry 812 is implemented by a capacitor 906 and a resistor 908, in charge pump 900. Capacitor 902 and resistor 904 are electrically coupled in series between negative node (−) of input port 114 and first control node 814, and capacitor 906 and resistor 908 are electrically coupled in series between positive node (+) of input port 114 and second control node 816.

Bias circuitry 808 is implemented in charge pump 900 by a first resistive device 910, a second resistive device 912, a first diode 914, and a second diode 916. First resistive device 910 and first diode 914 are each electrically coupled between first control node 814 and a power supply rail 918, and second resistive device 912 and second diode 916 are each electrically coupled between second control node 816 and power supply rail 918. First resistive device 910 electrically biases first transistor 802, and second resistive device 912 electrically biases second transistor 804. Diodes 914 and 916 clamp first control node 814 and second control node 816, respectively, to power supply rail 918, to limit voltage magnitude at first control node 814 and second control node 816.

Mirror circuitry 806 is implemented in charge pump 900 by a third transistor 920, a fourth transistor 922, p-type metal oxide semiconductor (PMOS) current mirror circuitry 924, a resistive device 926, and a resistive device 928. A respective gate G of each of third transistor 920 and fourth transistor 922 is electrically coupled to summing node 818, a respective source S of each of third transistor 920 and fourth transistor 922 is electrically coupled to a reference node 930. A drain D of third transistor 920 is electrically coupled to summing node 818, and a drain D of fourth transistor 922 is electrically coupled to PMOS current mirror circuitry 924. Resistive device 926 is electrically coupled between summing node 818 and reference node 930, and resistive device 928 is electrically coupled across output port 116. Third transistor 920 and fourth transistor 922 collectively mirror to differential signal $I_{diff}$ to generate first mirror signal $I_{m1}$, and PMOS current mirror circuitry 924 mirrors first mirror signal $I_{m1}$ to generate output signal 118 at output port 116. PMOS current mirror circuitry 924 is at least partially powered from power supply rail 918, and PMOS current mirror circuitry 924 includes a plurality of PMOS transistors (not shown). Resistive device 926 and 928 help ensure that output signal 118 has minimal magnitude when no differential-mode component DIFF in present in level-shifted signal 112.

Although FIGS. 8 and 9 illustrates the transistors as being n-channel and p-channel MOSFETs, charge pumps 800 and 900 could be modified to include a different type of transistors, e.g., BJTs, without departing from the scope hereof. Additionally, charge pumps 800 and 900 could be modified to replace the p-channel MOSFETs with n-channel MOSFETs, and vice versa, without departing from the scope hereof Although the resistive devices are depicted as being single resistors, one or more of these resistive devices could include a plurality of resistors, or one or more devices emulating resistors, without departing from the scope hereof.

Figure 10:
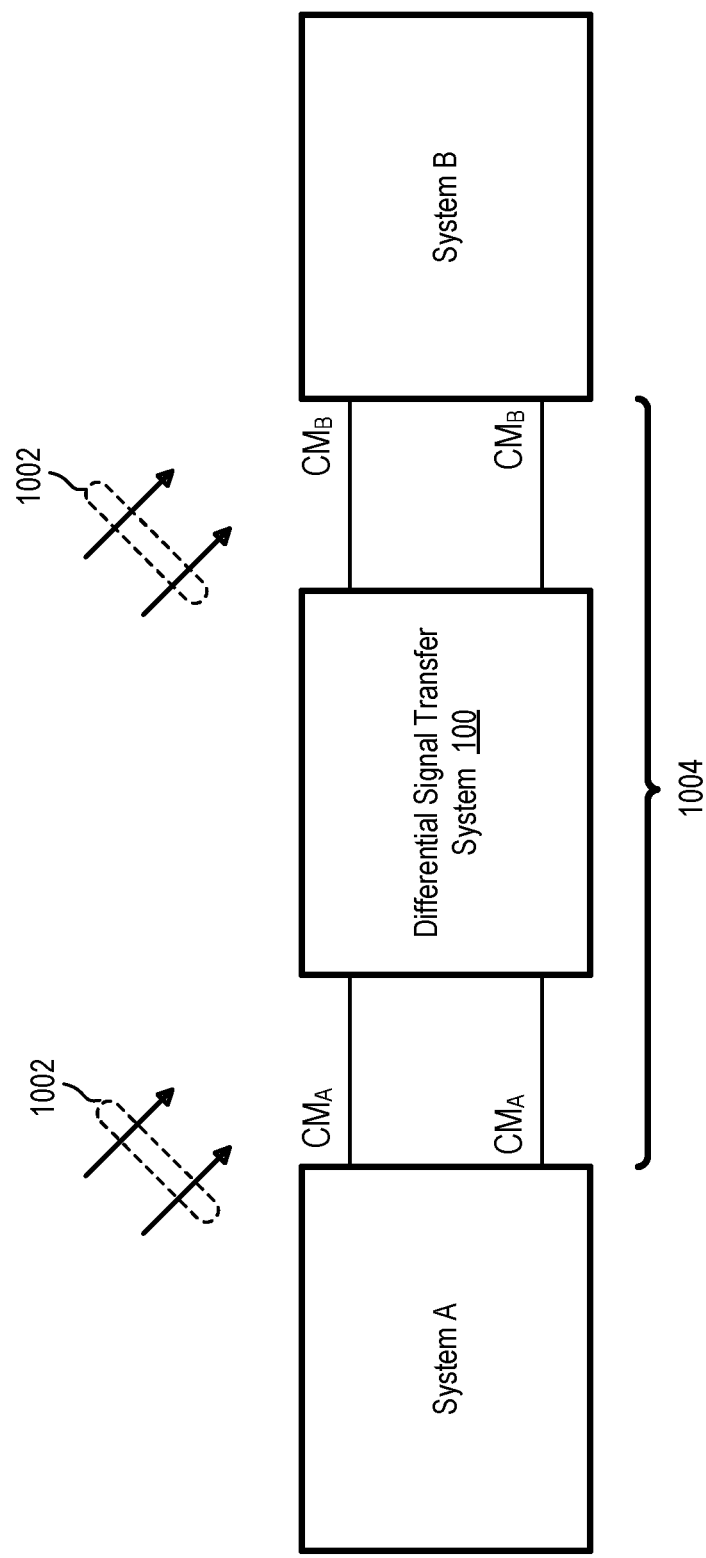
FIG. 10 is a schematic diagram illustrating use of the FIG. 1 differential signal transfer system to transfer a differential signal from one system to another system, according to an embodiment.
Figure 11:
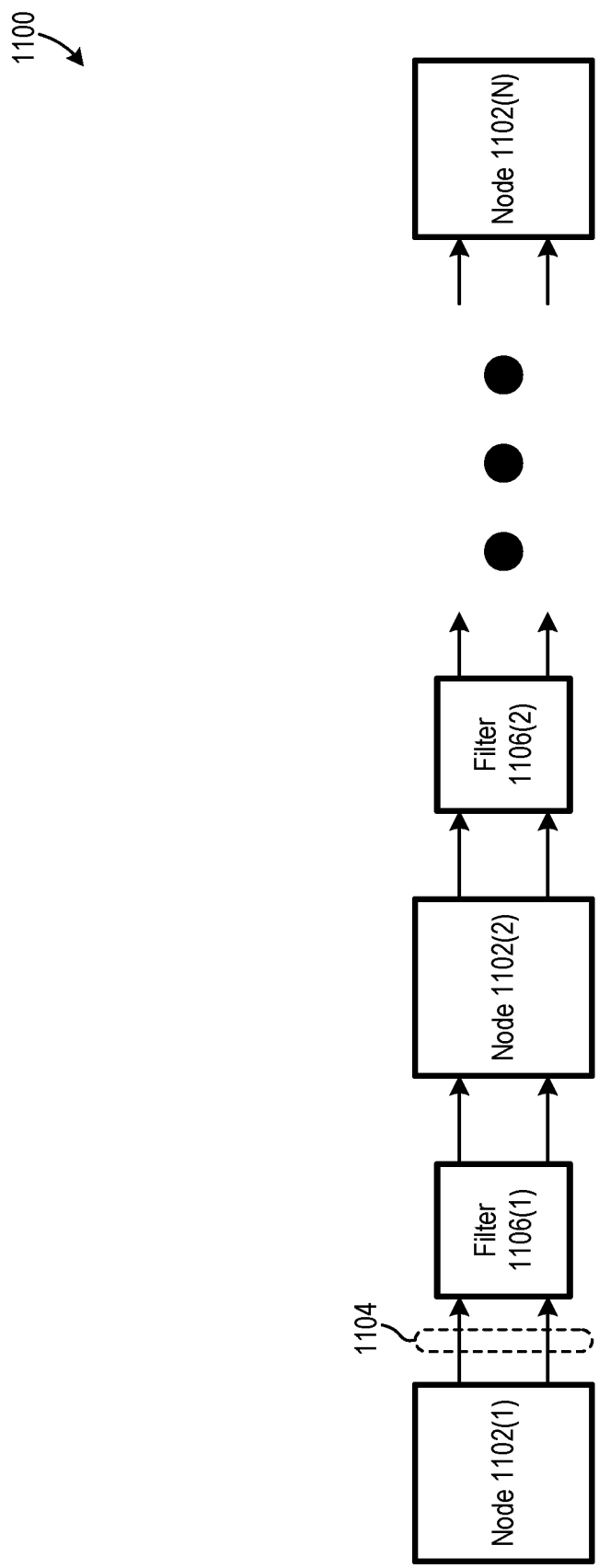
FIG. 11 is a schematic diagram illustrating a daisy-chain communication system including multiple instances of the FIG. 1 differential signal transfer system, according to an embodiment.

Discussed below with respect to FIGS. 10 and 11 are several example applications of differential signal transfer system 100. It should be appreciated, however, that differential signal transfer system 100 is not limited to use in these example applications. To the contrary, differential signal transfer system 100 could be used in many other applications to transfer a differential signal.

FIG. 10 is a schematic diagram illustrating use of differential signal transfer system 100 to transfer a differential signal from system A to system B. In some embodiments, systems A and B are automobile systems or industrial systems. In certain embodiments, systems A and B operate at different respective common-mode voltages $CM_A$ and $CM_B$, and differential signal transfer system 100 enables communication between these two systems because differential signal transfer system 100 rejects transmission of common-mode signals. In other embodiments, systems A and B operate at the same common-mode voltage, and differential signal transfer system 100 achieves galvanic isolation between systems A and B. The differential signal transmitted from system A to system B represents, for example, information to be transmitted from system A to system B.

In certain embodiments, there is significant noise 1002 along a communication path 1004 between systems A and B. Use of differential signal transfer system 100 in these embodiments may be particularly advantageous because differential signal transfer system 100 significantly rejects common-mode noise, as discussed above.

FIG. 11 is a schematic diagram illustrating a daisy-chain communication system 1100 including N nodes 1102 communicatively coupled in a chain by a communication bus 1104, where N is an integer greater than one. Communication bus 1104 is configured to transfer differential signals along the chain. A respective filter 1106 is communicatively coupled to the input of each node 1102. As discussed below, each node 1102 includes an instance of differential signal transfer system 100 of FIG. 1. In certain embodiments, each node 1102 is part of a battery system, e.g., a battery management system.

Figure 12:
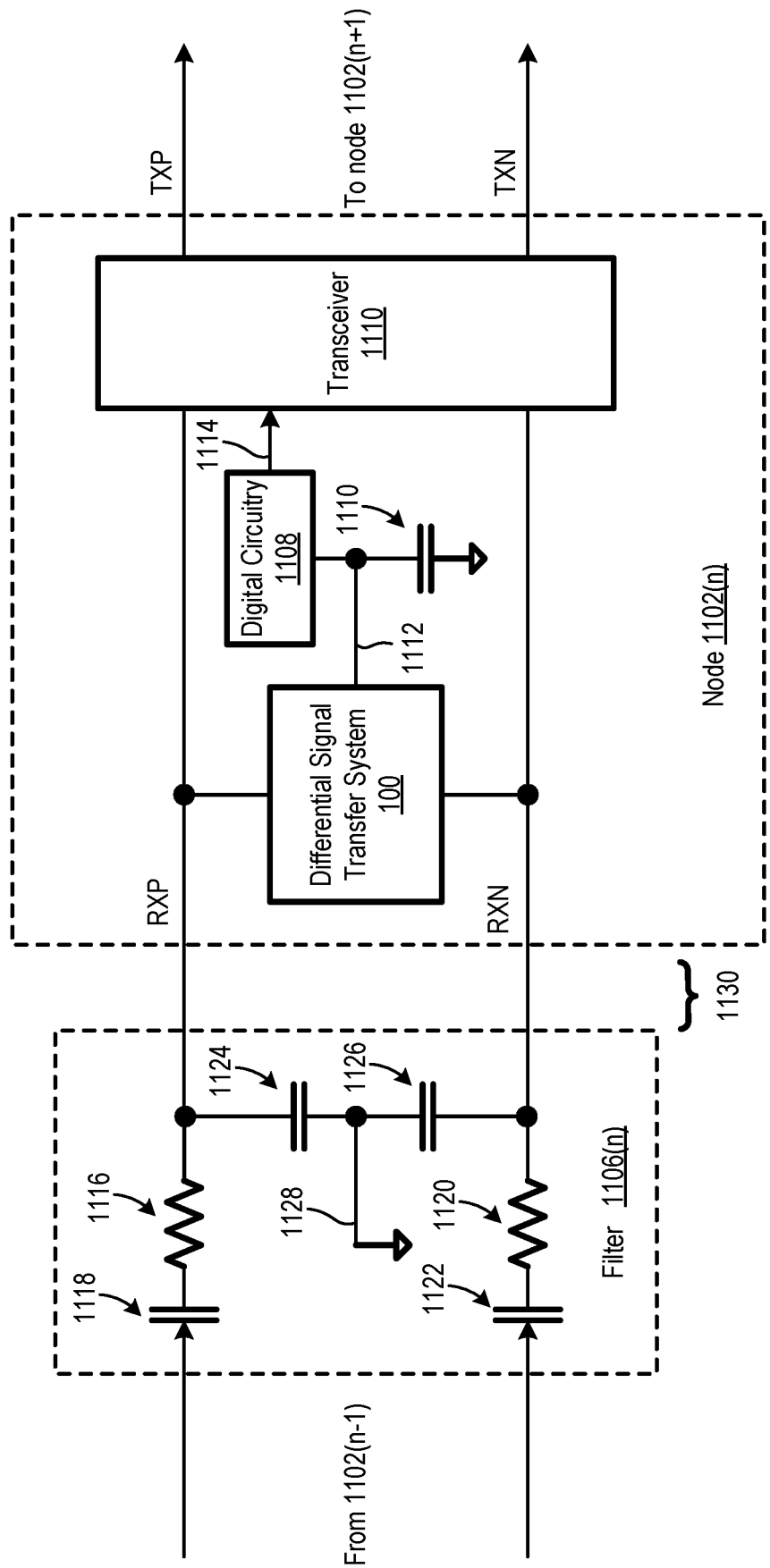
FIG. 12 is a schematic diagram illustrating one node of the FIG. 11 daisy-chain communication system.

FIG. 12 is a schematic diagram illustrating one instance of node 1102 and one instance of filter 1106, which are respectively referred to as node 1102(n) and filter 1106(n). The immediately preceding node 1102 and filter 1106 are respectively referred to as node 1102(n−1) and filter 1106(n−1), and the immediately following node 1102 and filter 1106 are respectively referred to as node 1102(n+1) and 1106(n+1). Each node 1102 includes an instance of differential signal transfer system 100, digital circuitry 1108, a transceiver 1110, and a capacitor 1110. Transceiver 1110 receives information from node 1102(n−1) via communication bus 1104 at inputs RXP and RXN, and transceiver 1110 transmits the information to node 1102(n+1) at outputs TXP and TXN. Differential signal transfer system 100 receives a differential signal from node 1102(n−1) via communication bus 1104, and differential signal transfer system 100 generates a signal 1112 in response to receiving the differential signal. Signal 1112 charges capacitor 1110, and digital circuitry 1108 detects capacitor 1110 being charged to a threshold value and asserts a signal 1114 in response thereto. Transceiver 1110 then transfers in differential mode a representation of signal 1114 to node 1102(n+1). The differential signal received by digital signal transfer system 100 is, for example, a wake-up signal or a shutdown command. For example, in certain embodiments, the differential signal received by digital signal transfer system 100 is a wake-up command, and each node 1102 wakes up from a sleep state in response to receiving the wake-up command from a previous node 1102 in the chain.

Each filter 1106 includes a resistive device 1116, a capacitor 1118, a resistive device 1120, a capacitor 1122, a capacitor 1124, and a capacitor 1126. Resistive device 1116 and capacitor 1118 are electrically coupled in series between node 1102(n−1) and input RXP, and resistive device 1120 and capacitor 1122 are electrically coupled between node 1102(n−1) and input RXN. Capacitor 1124 is electrically coupled between input RXP and a reference node 1128, and capacitor 1126 is electrically coupled between input RXN and reference node 1128. Although filter 1106 may block transmission of common-mode noise along communication bus 1104, common-mode noise may still enter communication bus in region 1130 of communication bus 1104 between filter 1106 and node 1102. Consequently, the ability of differential signal transmission system 100 to reject common-mode noise may be particularly advantageous in daisy-chain communication system 1100.

Figure 13:
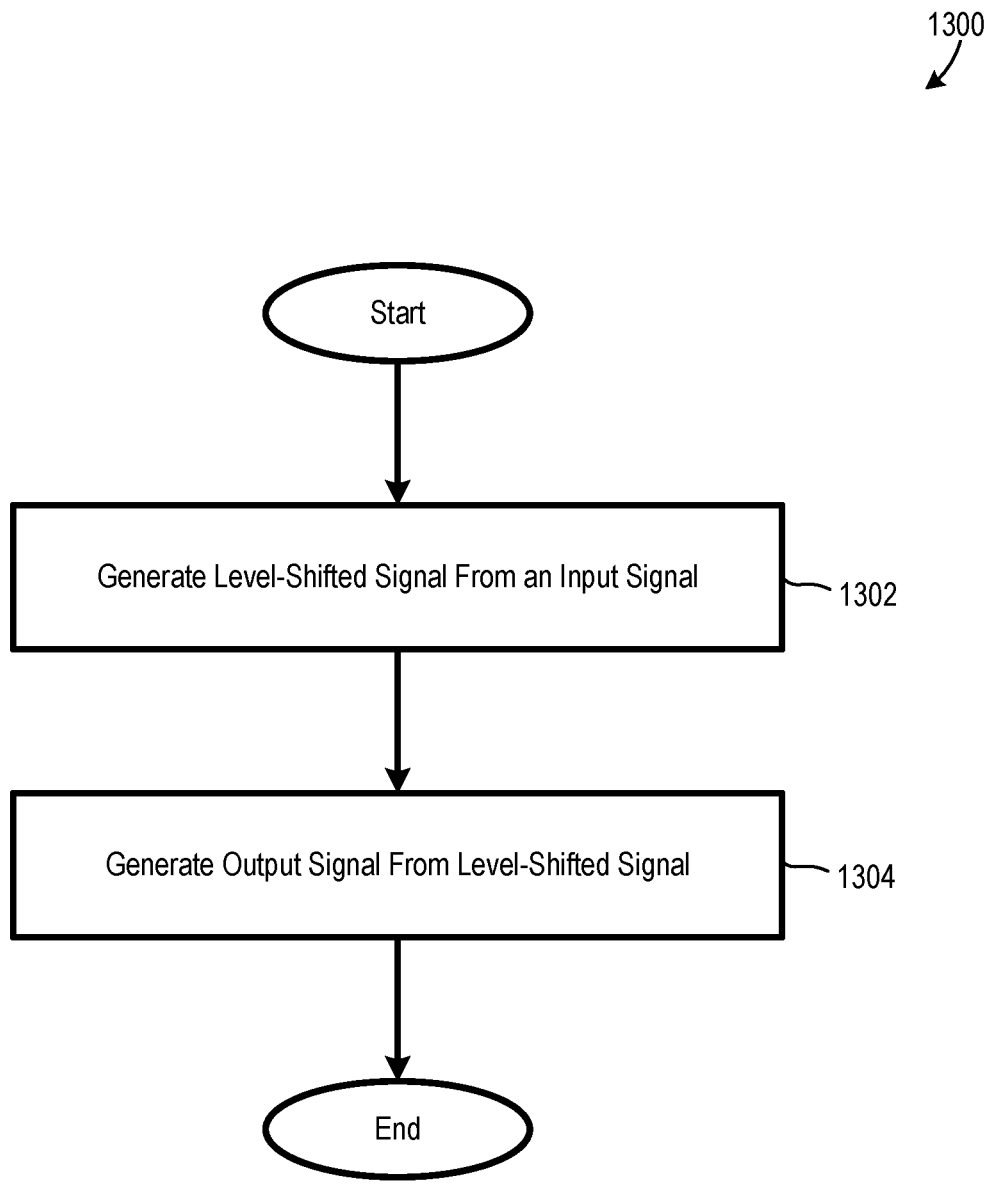
FIG. 13 is a flow chart illustrating a method for transferring a differential signal, according to an embodiment.

FIG. 13 is a flow chart illustrating a method 1300 for transferring a differential signal. In step 1302, a level-shifted signal is generated from an input signal including a differential-mode component and a first common-mode component, where the level shifted-signal includes the differential-mode component a second common-mode component that is different from the first common-mode component. In one example of step 1302, dynamic level-shifter 102 generates level-shifted signal 112 from input signal 110, where level-shifted signal 112 includes differential-mode component DIFF and second common-mode component $CM_2$ that is different from first common-mode component $CM_1$. In step 1304, an output signal is generated from the level-shifted signal, where the output signal includes the differential mode component. In one example of step 1304, common-mode rejection device 104 generate output signal 118 from level-shifted signal 112, where output signal 118 includes differential component DIFF.

Combinations of Features

Features described above may be combined in various ways without departing from the scope hereof. The following examples illustrate some possible combinations:

(A1) A differential signal transfer system may include a dynamic level-shifter and a common-mode rejection device. The dynamic level-shifter may be configured to (1) receive an input signal including a differential-mode component and a first common-mode component, and (2) generate a level-shifted signal from the input signal, the level-shifted signal including the differential-mode component and a second common-mode component that is different from the first common-mode component. The dynamic level-shifter may include (1) an input port configured to receive the input signal, (2) an output port configured to output the level-shifted signal, (3) first and second resistive devices each electrically coupled between the input port and the output port, (4) a first common-mode control circuit configured to sink current through each of the first and second resistive devices, and (5) a second common-mode control circuit configured to source current through each of the first and second resistive devices. The common-mode rejection device may be configured to receive the level-shifted signal and generate an output signal therefrom, the output signal including the differential-mode component.

(A2) In the differential signal transfer system denoted as (A1), the first common-mode component may have a first magnitude, the second common-mode component may have a second magnitude, and the second magnitude may be smaller than the first magnitude.

(A3) In any one of the differential signal transfer systems denoted as (A1) and (A2), the output signal may be substantially free of the second common-mode component.

(A4) In any one of the differential signal transfer systems denoted as (A1) through (A3), magnitude of the second common-mode component may range from a minimum value $VRAIL_{DW}$ to a maximum value $VRAIL_{UP}$.

(A5) In the differential signal transfer system denoted as (A4), the first common-mode control circuit may be configured to sink current through each of the first and second resistive devices to prevent magnitude of the second common-mode component from exceeding a maximum value $VRAIL_{UP}$, and the second common-mode control circuit may be configured to source current through each of the first and second resistive devices to prevent magnitude of the second common-mode component from falling below a minimum value $VRAIL_{DW}$.

(A6) In any one of the differential signal transfer systems denoted as (A1) through (A5), the dynamic level-shifter may further include third and fourth resistive devices electrically coupled in series across the output port, the third and fourth resistive devices may be electrically coupled together at a common-mode node CM, and each of the first common-mode control circuit and the second common-mode control circuit may be electrically coupled to the common-mode node CM.

(A7) In the differential signal transfer system denoted as (A6), the dynamic level-shifter may further include (1) a first capacitor electrically coupled in parallel with the third resistive device and (2) a second capacitor electrically coupled in parallel with the fourth resistive device.

(A8) Any one of the differential signal transfer systems denoted as (A6) and (A7) may further include a fifth resistive device electrically coupled between the common-mode node CM and a voltage source.

(A9) In any one of the differential signal transfer systems denoted as (A1) through (A8), the common-mode rejection device may include digital circuitry.

(A10) In any one of the differential signal transfer systems denoted as (A1) through (A8), the common-mode rejection device may include a charge pump.

(A11) In the differential signal transfer system denoted as (A10), the charge pump may be configured to transmit the differential-mode component of the level-shifted signal while rejecting the second common-mode component of the level-shifted signal.

(A12) In the differential signal transfer system denoted as (A10), the charge pump may include first and second transistors collectively configured generate a differential current signal in response to the differential-mode component of the level-shifted signal.

(A13) In the differential signal transfer system denoted as (A12), the charge pump may further include mirror circuitry configured to mirror the differential current signal to generate the output signal.

(A14) In any one of the differential signal transfer systems denoted as (A12) and (A13), the first and second transistors may be collectively configured to reject the second common-mode component of the level-shifted signal.

(B1) A method for transferring a differential signal may include (1) coupling a differential-mode component of an input signal between an input port of a dynamic level-shifter and an output port of the dynamic level-shifter via first and second resistive devices of the dynamic level-shifter, to generate a differential-mode component of a level-shifted signal, each of the first and second resistive devices being electrically coupled between the input port of the dynamic level-shifter and the output port of the dynamic level-shifter, (2) sinking current through each of the first and second resistive devices to prevent magnitude of a common-mode component of the level-shifted signal from exceeding a maximum value $VRAIL_{UP}$, (3) sourcing current through each of the first and second resistive devices to prevent the magnitude of the common-mode component of the level-shifted signal from falling below a minimum value $VRAIL_{DW}$, and (4) generating an output signal from the level-shifted signal using a common-mode rejection device, the output signal including the differential-mode component of the level-shifted signal.

(B2) The method denoted as (B1) may further include fixing magnitude of the common-mode component of the level-shifted signal to a predetermined value when magnitude of a common-mode component of the input signal is static.

(B3) Any one of the methods denoted as (B1) and (B2) may further include rejecting the common-mode component of the level-shifted signal using the common-mode rejection device, to generate the output signal.

(B4) Any one of the methods denoted as (B1) through (B3) may further include generating a differential current signal in response to the differential-mode component of the level-shifted signal.

(B5) The method denoted as (B4) may further include mirroring the differential current signal to generate the output signal.

(B6) Any one of the methods denoted as (B4) and (B5) may further include transmitting the differential-mode component of the level-shifted signal through filtering circuitry, before generating the differential current signal.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall therebetween.

What is claimed is:

1. A differential signal transfer system, comprising:
    a dynamic level-shifter, configured to:
        receive an input signal including a differential-mode component and a first common-mode component, and
        generate a level-shifted signal from the input signal, the level-shifted signal including the differential-mode component and a second common-mode component that is different from the first common-mode component,
    the dynamic level-shifter including:
        an input port configured to receive the input signal,
        an output port configured to output the level-shifted signal,
        first and second resistive devices each electrically coupled between the input port and the output port,
        a first common-mode control circuit configured to sink current through each of the first and second resistive devices,
        a second common-mode control circuit configured to source current through each of the first and second resistive devices, and
        third and fourth resistive devices electrically coupled in series across the output port, the third and fourth resistive devices being electrically coupled together at a common-mode node CM, and each of the first common-mode control circuit and the second common-mode control circuit being electrically coupled to the common-mode node CM; and
    a common-mode rejection device configured to receive the level-shifted signal and generate an output signal therefrom, the output signal including the differential-mode component.

2. The differential signal transfer system of claim 1, wherein:
    the first common-mode component has a first magnitude;
    the second common-mode component has a second magnitude; and
    the second magnitude is smaller than the first magnitude.

3. The differential signal transfer system of claim 2, wherein the output signal is substantially free of the second common-mode component.

4. The differential signal transfer system of claim 1, wherein magnitude of the second common-mode component ranges from a minimum value $VRAIL_{DW}$ to a maximum value $VRAIL_{UP}$.

5. The differential signal transfer system of claim 1, wherein:
the first common-mode control circuit is configured to sink current through each of the first and second resistive devices to prevent magnitude of the second common-mode component from exceeding a maximum value $VRAIL_{UP}$; and
the second common-mode control circuit is configured to source current through each of the first and second resistive devices to prevent magnitude of the second common-mode component from falling below a minimum value $VRAIL_{DW}$.

6. The differential signal transfer system of claim 1, wherein the dynamic level-shifter further comprises:
a first capacitor electrically coupled in parallel with the third resistive device; and
a second capacitor electrically coupled in parallel with the fourth resistive device.

7. The differential signal transfer system of claim 1, further comprising a fifth resistive device electrically coupled between the common-mode node CM and a voltage source.

8. The differential signal transfer system of claim 1, wherein the common-mode rejection device comprises digital circuitry.

9. The differential signal transfer system of claim 1, wherein the common-mode rejection device comprises a charge pump.

10. The differential signal transfer system of claim 9, wherein the charge pump is configured to transmit the differential-mode component of the level-shifted signal while rejecting the second common-mode component of the level-shifted signal.

11. The differential signal transfer system of claim 9, wherein the charge pump comprises first and second transistors collectively configured generate a differential current signal in response to the differential-mode component of the level-shifted signal.

12. The differential signal transfer system of claim 11, wherein the charge pump further comprises mirror circuitry configured to mirror the differential current signal to generate the output signal.

13. The differential signal transfer system of claim 11, wherein the first and second transistors are collectively configured to reject the second common-mode component of the level-shifted signal.

14. A method for transferring a differential signal, comprising:
coupling a differential-mode component of an input signal between an input port of a dynamic level-shifter and an output port of the dynamic level-shifter via first and second resistive devices of the dynamic level-shifter, to generate a differential-mode component of a level-shifted signal, each of the first and second resistive devices being electrically coupled between the input port of the dynamic level-shifter and the output port of the dynamic level-shifter;
sinking current through each of the first and second resistive devices to prevent magnitude of a common-mode component of the level-shifted signal from exceeding a maximum value $VRAIL_{UP}$;
sourcing current through each of the first and second resistive devices to prevent the magnitude of the common-mode component of the level-shifted signal from falling below a minimum value $VRAIL_{DW}$;
generating an output signal from the level-shifted signal using a common-mode rejection device, the output signal including the differential-mode component of the level-shifted signal, the step of generating the output signal including:
generating a differential current signal in response to the differential-mode component of the level-shifted signal, and
mirroring the differential current signal to generate the output signal.

15. The method of claim 14, further comprising fixing magnitude of the common-mode component of the level-shifted signal to a predetermined value when magnitude of a common-mode component of the input signal is static.

16. The method of claim 14, further comprising rejecting the common-mode component of the level-shifted signal using the common-mode rejection device, to generate the output signal.

17. The method of claim 14, further comprising transmitting the differential-mode component of the level-shifted signal through filtering circuitry, before generating the differential current signal.

18. A differential signal transfer system, comprising:
a dynamic level-shifter, configured to:
receive an input signal including a differential-mode component and a first common-mode component, and
generate a level-shifted signal from the input signal, the level-shifted signal including the differential-mode component and a second common-mode component that is different from the first common-mode component,
the dynamic level-shifter including:
an input port configured to receive the input signal,
an output port configured to output the level-shifted signal,
first and second resistive devices each electrically coupled between the input port and the output port,
a first common-mode control circuit configured to sink current through each of the first and second resistive devices, and
a second common-mode control circuit configured to source current through each of the first and second resistive devices; and
a common-mode rejection device including one of digital circuitry and a charge pump, the common-mode rejection device being configured to receive the level-shifted signal and generate an output signal therefrom, the output signal including the differential-mode component.

19. The differential signal transfer system of claim 18, wherein:
the first common-mode component has a first magnitude;
the second common-mode component has a second magnitude; and
the second magnitude is smaller than the first magnitude.

* * * * *